United States Patent [19]
Rattey et al.

[11] Patent Number: 5,289,549
[45] Date of Patent: Feb. 22, 1994

[54] B-ADAPTIVE ADPCM IMAGE DATA COMPRESSOR

[75] Inventors: Paul A. Rattey, Portsmouth; Richard S. Pascucci, Warwick, both of R.I.

[73] Assignee: Raytheon Company, Lexington, Mass.

[21] Appl. No.: 71,947

[22] Filed: Jun. 4, 1993

Related U.S. Application Data

[63] Continuation of Ser. No. 809,782, Dec. 18, 1991, abandoned.

[51] Int. Cl.$^5$ .................. H04N 7/12; H04N 1/417
[52] U.S. Cl. ................... 382/56; 358/261.2; 348/384
[58] Field of Search ............. 382/56; 358/133, 136, 358/430, 433, 432, 261.2

[56] References Cited

U.S. PATENT DOCUMENTS

| | | | |
|---|---|---|---|
| 4,903,317 | 2/1990 | Nishihara et al. | 382/56 |
| 4,955,066 | 9/1990 | Notenboom | 382/56 |
| 5,043,809 | 8/1991 | Shikakura et al. | 382/56 |
| 5,054,103 | 10/1991 | Yasuda et al. | 382/56 |
| 5,109,433 | 4/1992 | Notenboom | 382/40 |

OTHER PUBLICATIONS

Cohn, David, L. and James L. Melsa, "The Residual Encoder—An Improved ADPCM System for Speech Digitization", Sep. 1975, IEEE Transactions on Communications, vol. Com-23, No. 9, pp. 935-941.

Honig, Michael L., and David G. Messerschmitt, "Comparison of Adaptive Linear Prediction Algorithms in ADPCM", Jul 1982, IEEE Transactions on Communications, vol. Com-69, No. 3, pp. 1775-1785.

Jain, Anil K., "Image Data Compression: A Review", Mar. 1981, Proceedings of the IEEE, vol. 69, No. 3, pp. 349-391.

Rosenthal, Lewis H., L. R. Rabiner, R. W. Schafer, P. Cummiskey, and J. L. Flanagan, "A Multiline Computer Voice Response System Utilizing ADPCM Coded Speech", Oct. 1974, IEEE Transactions on Acoustics, Speech, and Signal Processing, vol. ASSP-22, No. 5, pp. 339-352.

Primary Examiner—Leo H. Boudreau
Assistant Examiner—Christopher Kelley
Attorney, Agent, or Firm—Donald F. Mofford; Richard M. Sharkansky

[57] ABSTRACT

An apparatus for processing a stream of digital data to provide a set of linear prediction coefficients and prediction error sequence representing said block of data which, when used to reconstruct the block of data, will reconstruct the data with a minimum distortion level is described.

14 Claims, 4 Drawing Sheets

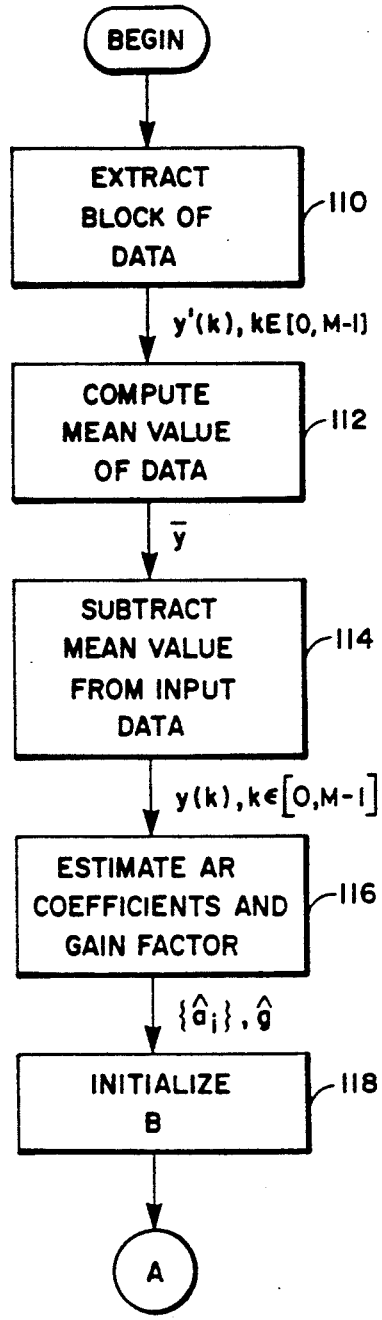
_Fig. 2A_
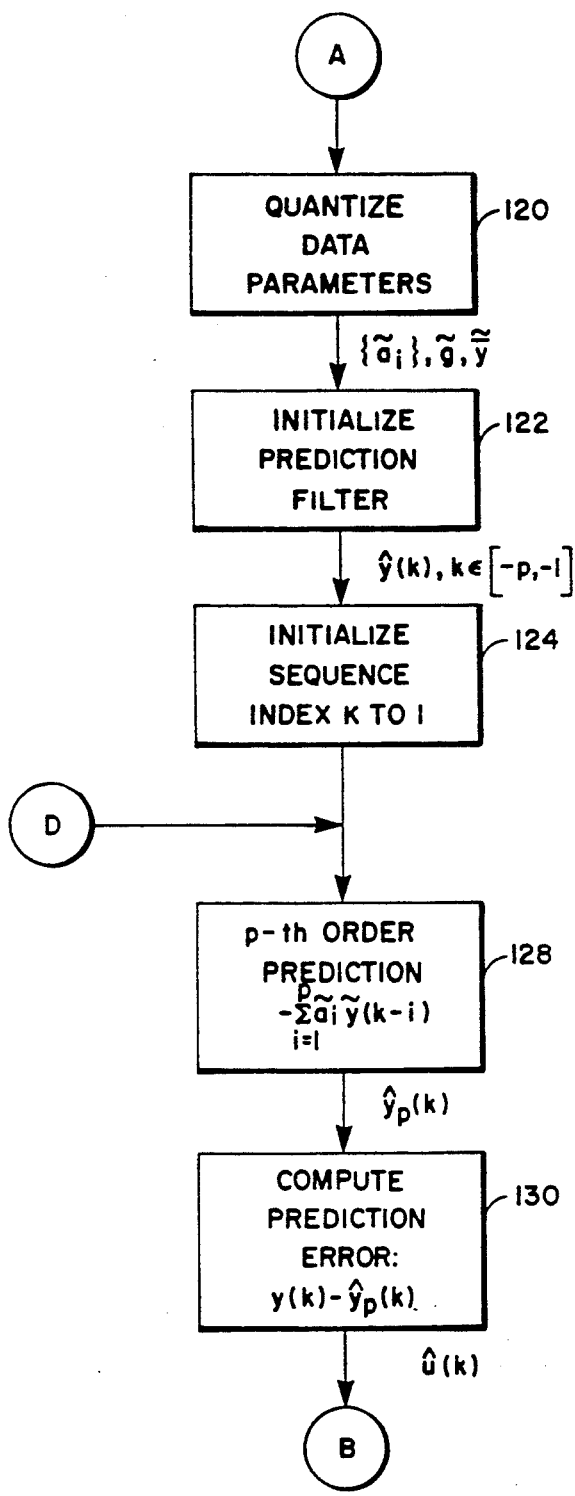
_Fig. 2B_

B-ADAPTIVE ADPCM IMAGE DATA COMPRESSOR

This application is a continuation of application Ser. No. 07/809,782 filed Dec. 18, 1991, now abandoned.

BACKGROUND OF THE INVENTION

This invention relates generally to data compression techniques and more particularly to adaptive differential pulse code modulation (ADPCM) compression of data.

As is known in the art, one of the demanding applications in digital signal processing involves the efficient transmission and storage of data corresponding to information having a relatively high degree of redundancy. For example, advances in computer technology for mass storage and digital processing have fostered the development of digital processing of image data, speech data, telemetry data, and so forth. However, the large amount of data used in such digital processing has increased the need for implementing advanced data compression techniques to remove redundancy from the data and thus improve efficiency of transmission and/or storage of such data.

In particular, one application of digital processing of large quantities of data is that data relating to image data and, in particular, image data which is obtained through processing of sonar signals. In general, image data and, in particular, sonar image data is characterized as having a high degree of redundancy, or put another way, is characterized as being relatively predictable and smooth. For example, for most sonar image data sets, much of the data is "noise only data" and thus rapid changes in the data are relatively infrequent and smooth.

A technique used to reduce the amount of data used to represent an input data stream (i.e. to compress the data) is the so-called "adaptive differential pulse code modulation technique" (ADPCM).

ADPCM processing involves partitioning input data into data sequences of data groups or data blocks to be analyzed and adaptively characterizing such data by computation of linear prediction parameters for each data block analyzed. These linear prediction parameters include quantized prediction coefficients and a quantized prediction error sequence. In the quantized prediction error sequence a fixed number of bits is used to represent the prediction error associated with said prediction error sample in the quantized prediction error sequence. The ultimate goal of ADPCM compression is to obtain a high compression ratio (i.e. a ratio of the number of original bits in the input data is the number of bits in the compressed data) without a significant increase in distortion imparted to data reconstructed from the ADPCM parameters.

A problem often occurs with an ADPCM data compressor operating at high compression ratios. At high compression ratios, that is, at a high ratio of input data bits to output data bits reconstruction of the input data from the ADPCM parameters for all data blocks produces on average acceptable performance. However, some individual blocks may have an unacceptable performance as measured by an error signal or distortion level if the blocks contain data that are substantially different than the typical data encountered during compression of the blocks. For image data, this might result from an occurrence of an isolated bright spot in the image frame which introduces a rapid increase in intensity in the data and could, for example, be related to a object or target identified by a sonar system.

One technique which could be used to compensate for errors induced by rapid transitions in the data would be to increase for each block of data the number of bits used to represent the prediction error sequence. One drawback of increasing the number of bits used to represent the prediction error is that the compression ratio is significantly decreased and as a result the performance of the ADPCM technique as a compressor of data is degraded.

SUMMARY OF THE INVENTION

In accordance with the present invention, a method of processing a stream of digital data includes the steps of partitioning the stream of data into a plurality of blocks of data samples and computing from a first block of data samples, a set of quantized linear prediction coefficients, a quantized gain, a quantized input mean, a unquantized prediction error sequence over the block of data, and quantizing the unquantized prediction error sequence to provide a quantized prediction error sequence with each sample in the unquantized prediction error sequence being represented by a preselected number of bits in the quantized prediction error sequence. The method further includes the steps of reconstructing the input data stream from the quantized gain, quantized mean level, set of quantized linear prediction coefficients and quantized prediction error sequence associated with said block of data an-d comparing the reconstructed input data to the original input data to provide a distortion level representative of the difference between the reconstructed data and the original input data. The method further includes the steps of comparing this distortion level to a preselected distortion level maximum, asserting a signal if the distortion level maximum is exceeded, and in response to the assertion of said signal, recomputing a new unquantized prediction error sequence for said block of data and computing a new quantized prediction error sequence using a higher number of bits to represent the prediction error in each sample of the unquantized prediction error sequence. With this particular arrangement, a technique for adaptively compressing data blocks having data samples which rapidly increase in value such as intensity or contrast, such as illustratively might result from the occurrence of an isolated bright spot or target in image data such as sonar image data or other parameter for other types of data is provided. The technique does not provide a significant reduction in the compression ratio over a plurality of blocks of data while it reduces distortion level of reconstructed image data from use of the ADPCM coefficients. For sonar data applications, for example, since most of the data is generally characterized as having a high degree of redundancy or is relatively smooth and predictable, the overall compression ratio of the image data will be substantially unaffected by the processing technique. However, this processing technique permits the adaptive recomputation of quantized prediction error sequences for those blocks of data representing portions of data corresponding to large variations in said data. In image data such large variations could represent large differences in contrast or intensity levels. In the prior techniques such data blocks having relatively non-smooth and unpredictable data would produce ADPCM parameters that when used to reconstruct the original data would introduce a relatively large distortion level to the reconstructed data. Here, by selectively increasing the number of bits to representing the prediction error in the quantized prediction error sequence and recalculating quantized prediction error sequence using the increased number of bits, reconstruction of the input data from the recalculated quantized prediction error sequence, quantized linear prediction coefficients, quantized gain, and quantized input mean will provide reconstructed input data having lower distortion levels than prior techniques. At the same time, however, the overall data compression ratio over the plurality of data blocks is not significantly reduced.

In accordance with a further aspect of the present invention, apparatus for compressing a stream of digital data includes means for partitioning the stream of digital data into a plurality of blocks of data samples and means for computing for a first block of data quantized linear prediction coefficients, quantized gain, quantized mean level, a unquantized prediction error sequence with each prediction error sample in the unquantized prediction error sequence corresponding to a data sample in the block of data and with said computing means further comprising quantizing means, fed by the unquantized prediction error sequence, for providing a quantized prediction error sequence with each prediction error sample in the unquantized prediction error sequence being represented by a preselected number of bits in the quantized prediction error sequence. The apparatus further includes means for reconstructing the input data associated with said first block of data from the quantized linear prediction coefficients, quantized gain, quantized input mean, and the quantized prediction error sequence. The apparatus further includes means fed by the original input data and reconstructed input data for providing a distortion level representative of a difference between the reconstructed data and the input data, and means for comparing the distortion level to a preselected distortion level maximum and for asserting a signal if the computed distortion level is higher than the preselected distortion level maximum. In response to an assertion of said signal, the original input data is fed back to the computing means to recompute the unquantized prediction error sequence and the unquantized prediction error sequence is fed to the prediction error quantizing means to provide a quantized prediction error sequence for the block of data using a higher number of bits to represent the correspondence between the quantized prediction error sequence and the unquantized prediction error sequence. With such an arrangement, apparatus is provided for efficiently compressing digital data using an adaptive differential pulse code modulation technique. For those blocks of digital data having large levels of non-smoothness or unpredictability, apparatus is provided to minimize reconstruction errors or distortion associated with reconstructed data from ADPCM parameters, without substantially degrading the overall compression ratio of the stream of data.

BRIEF DESCRIPTION OF THE DRAWINGS

The foregoing features of this invention, as well as the invention itself, may be more fully understood from the following detailed description of the drawings, in which:

FIGS. 2A-2D are a series of flow charts showing steps in providing B-adaptive differential pulse code modulator compressor.

DESCRIPTION OF THE PREFERRED EMBODIMENTS

Figure 1:
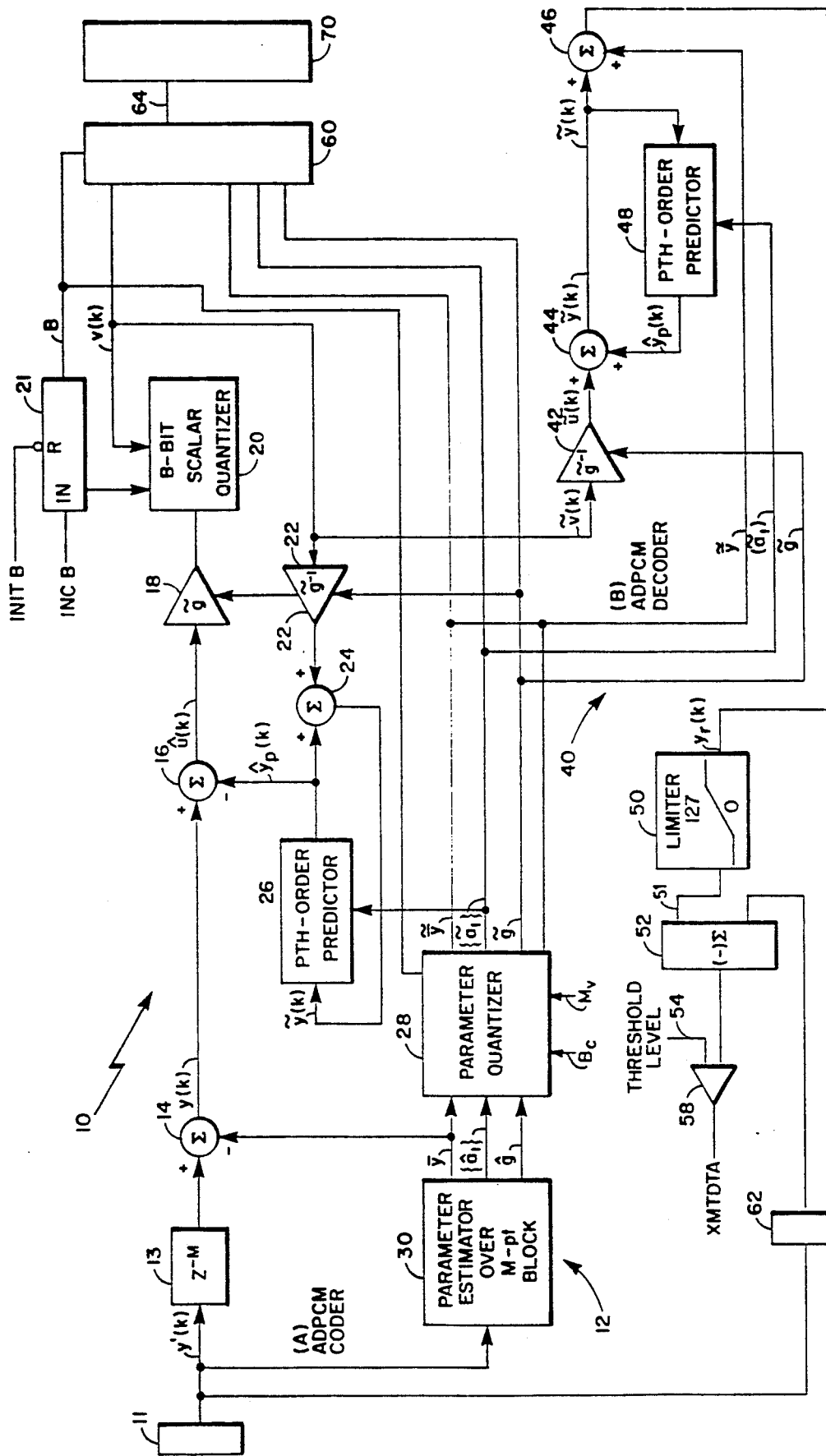
FIG. 1 is a block diagram of a B-adaptive differential pulse code modulator compressor in accordance with the present invention.
Figure 2C:
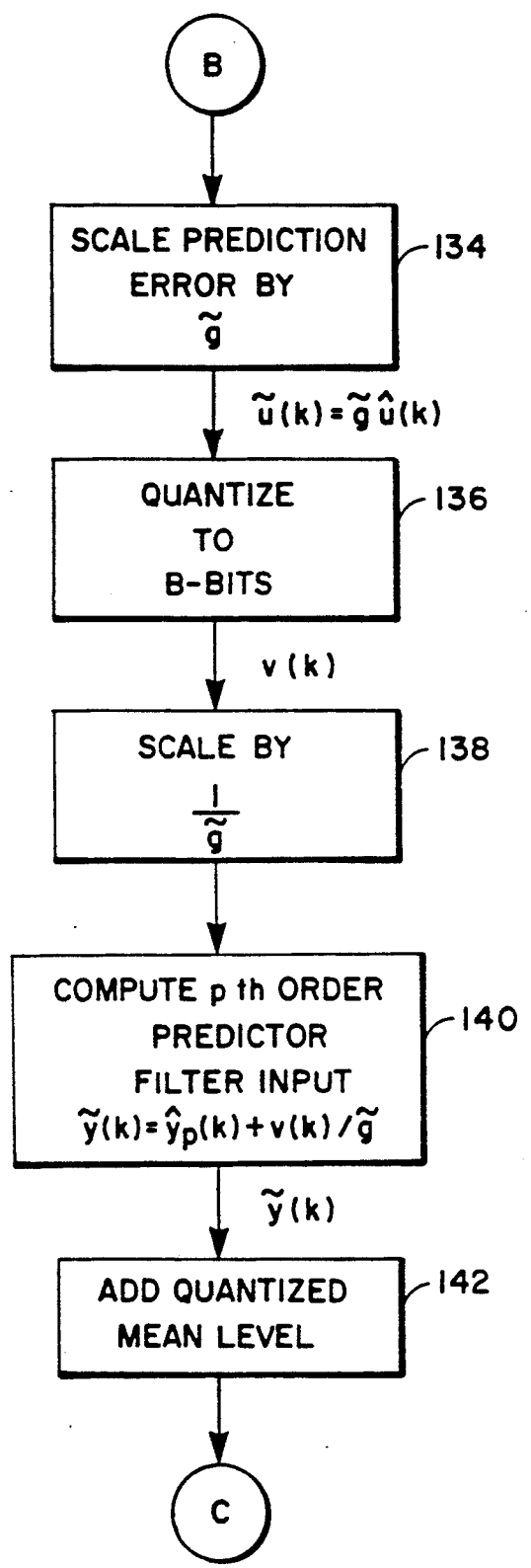
Figure 2D:
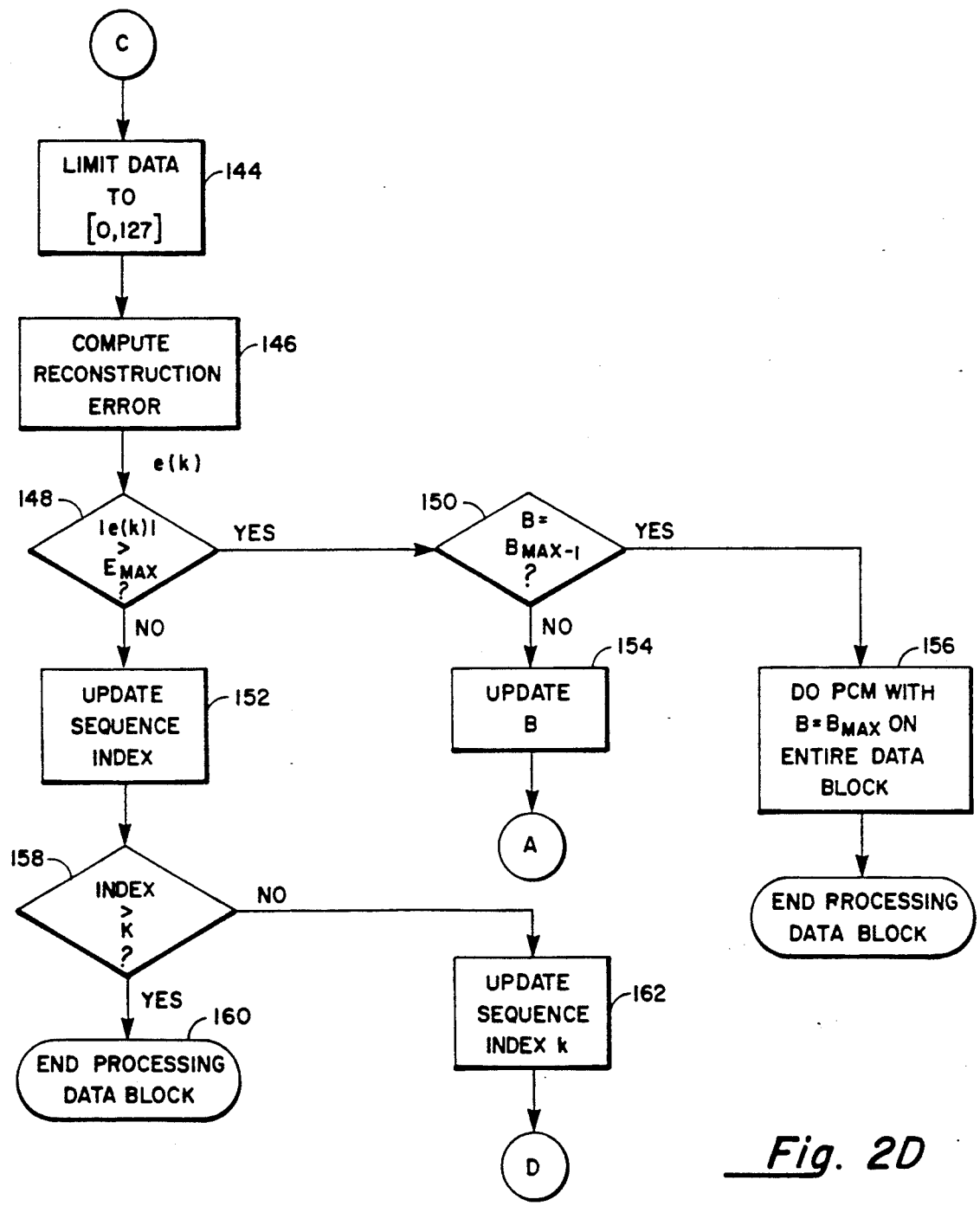

Referring now to FIG. 1, a B-adaptive ADPCM data compressor 10 (B-adaptive, adaptive differential pulse code modulator) is shown to include an adaptive differential pulse code modulator encoder 12 and an adaptive differential pulse code modulator decoder 40. Adaptive differential pulse code modulator encoder 12 provides a set of so-called ADPCM parameters including a quantized input data mean $\bar{y}$; a set of quantized linear prediction coefficients $\{\hat{a}_i\}$; quantized gain $\hat{g}$; and a quantized prediction error sequence v(k). These parameters are used to represent a block of input data. This representation is more efficient (i.e. uses fewer bits of data) than the original data. Typically such parameters are fed to a buffer device 60 and transmitted over a channel to a user device 70. The user device 70 may include a memory to store such parameters, as well as a ADPCM decoder (not shown) similar to decoder 40, to reconstruct the input data from the transmitted ADPCM parameters.

Here, however, the buffer 60 will not be fed valid ADPCM parameters until the compressor 10 first tests the ADPCM parameters to insure that the number of bits to which the prediction error in the quantized prediction error sequence was quantized to is proper taking into consideration the nature of the data. This is done on a block by block basis, as will be discussed below.

The adaptive differential pulse code modulator encoder 12 is fed from an input device 11 such as an A/D converter, buffer memory, and so forth. It should also be understood that depending upon specific system requirements and characteristics often buffer 11 may accommodate far more data samples than those contained in one data block to insure that no data are lost. The encoder 12 is shown to include an input delay 13 ($z^{-M}$) which is a data delay (i.e. a memory) corresponding to a length of M data elements or samples to provide a block of data having M number of elements or samples. Typically, each of the elements or samples in the data block of length M is represented by several bits of digital data with a "byte" or eight bits of data commonly being used. Further as used here, seven of said bits can represent a data level whereas the eighth bit can be a sign bit. In general, the ADPCM encoder 12 and decoder 40 each operate over blocks of data samples. Here, each of the blocks of data have a length which is denoted by "M" or M number of samples. A typical length M for a block is 128 data samples although other lengths could alternatively be used.

An input data stream y'(k) is fed to delay or memory 13 and is thus partitioned into a block of data of length M. The selection of the block length M is made in accordance with the particular characteristics of the data to be compressed, as would be known by one of ordinary skill in the art. Generally, the length M is chosen over a number of samples over which ADPCM parameters can be generated to adequately represent the characteristics of the original data. In general, each of the data points in the M size block could be of eight (8) bits or one (1) byte and can be any digital data such as representing variations in image intensity, image contrast data, or alternatively speech data, telemetry data, and so forth.

The delay element 13 provides a delayed input data stream $y'_d(k)$. The period of the delay is sufficient to delay the block of data points M to enable an estimator 30 to provide a set of estimated ADPCM parameters to be completed on the data $y'(k)$. That is, as it is known, the input data $y'(k)$ is also fed to parameter estimator 30 which computes parameters $\bar{y}$, $\{\hat{a}_i\}$, and $\hat{g}$. These parameters represent, respectively, an unquantized input signal mean level ($\bar{y}$), unquantized linear prediction coefficients $\{\hat{a}_i\}$, and a unquantized gain factor $\hat{g}$ which is a function of the estimated unquantized prediction error. The parameter estimator 30 provides these parameters in accordance with equations 1-3 below.

$$\text{mean value: } \bar{y} = M^{-1} \sum_{k=0}^{M-1} y'(k) \quad \text{Equation 1}$$

i.e. here $\bar{y}$ is removed from $y'_d(k)$ to provide $y(k)$ before calculating LPC coefficients and gain.

LPC coefficients  Equation 2A
$$I_{yy}(l) = M^{-1} \sum_{k=0}^{M-1-l} y(k)y(k+1), (l = 0, 1, \ldots p)$$

The Levinson recursive algorithm used to provide the ADPCM parameters is an iterative process. An initial step is to initialize the parameters according to:

$$a_1(1) = -r_{yy}(1)/r_{yy}(0)$$

$$p_1 |(1 - |a_1(1)|^2) r_{yy}(0)$$

For a prediction order of $K = 2$, the following parameters are determined:

$$a_k(k) = -\frac{r_{yy}(k) + \sum_{l=1}^{k-1} a_{k-1}(l) r_{yy}(k-1)}{P_{k-1}}$$

$$a_k(i) = a_{k-1}(i) + a_k(k) a_{k-1}(k-i)$$

$$i = 1, 2, \ldots k-1$$

$$P_k = (1 - |a_k(k)|^2) P_{k-1}$$

The order is then increased by 1, thus k is equal to $k+1$ and the order is tested to determine if $k = p + 1$. If $k = p + 1$, the coefficients have been determined. If $k \neq p + 1$, then the coefficients $a_K(k) + a_K(i)$ are recalculated.

$$\text{gain: } g = \frac{|V_{MAX}|}{C\sqrt{P_{p+1}}} \quad \text{Equation 3}$$

$$\text{where } V_{min} = \begin{cases} -2^{(B-1)} + 1, & B > 1 \\ -1 & \text{otherwise} \end{cases}$$

$$V_{max} = \begin{cases} 2^{(B-1)}, & B > 1 \\ 1, & \text{otherwise} \end{cases}$$

C is a design parameter called the Crest factor.

In general, Equations 1-3 above are well known equations used in providing the linear prediction coefficients, input mean, and gain level for a differential pulse code modulation compression technique. For example, Equations 2A and 2B are so-called Levinson's recursion algorithm to calculate predictor coefficients chosen to minimize the power of the prediction error sequence $u(k)$, as will be discussed below. In general, linear prediction is an attempt to predict an unobserved sample $y(k)$ based on previous p samples of the sequence y, where the number of p samples represents the order of the linear prediction. If the prediction order matches the order of the process, then the noise of the process is equal to the noise in the prediction and, accordingly, the linear predictor has completely removed all redundancy in the samples of $y(k)$.

The unquantized input signal mean level ($\bar{y}$) is fed to one input of summer 14 whereas the other input of summer 14 is fed by the delayed input data $y'_d(k)$. The unquantized input signal mean level $\bar{y}$ is subtracted from the delayed input data $y'(k)$ to provide a zero mean input data sequence $y(k)$. This zero mean input data sequence $y(k)$ is fed to a first input of a second summer 16.

A parameter quantizer 28 is fed by unquantized input signal mean level ($\bar{y}$), unquantized linear prediction coefficient $\{\hat{a}_i\}$, and the unquantized gain factor ($\hat{g}$). The parameter quantizer is also fed signals representing $B_c$ the number of bits used to quantize said parameters and $M_v$ the minimum/maximum values allowed for each of said parameters. The parameter quantizer provides a quantized input signal mean $\tilde{y}$, linear prediction coefficients $\{\tilde{a}_i\}$ and gain ($\tilde{g}$). In general, the quantizing operation is a mapping type of operation in which a preselected number of levels or steps are determined (i.e. $2^{BC}$ levels where $B_C$ is the number of quantizer bits) and minimum and maximum values ($M_v$) are established for the steps. The parameters fed to the quantizer are mapped to one of said steps or levels in accordance with the value of the parameter and if the value of the parameters is beyond either the maximum or minimum values $M_v$ the parameter is clipped to one of the step extremes (i.e. the first or last step). These quantized values are fed to a storage device 60 which stores said values, as well as values B and $v(k)$ as will be described. The parameters are stored for eventual use (i.e. transmission, storage, etc.) upon an indication of a data valid signal (as will be described). The quantized linear prediction coefficient and gain are fed respectively to a $p^{th}$ order predictor circuit 26 and a scalar circuit 22.

The $p^{th}$ order predictor 26 operates on the data stream $\tilde{y}(k)$ which is the sum of the scale value of $v(k)$ and the $p^{th}$ order predictor data sequence $\hat{y}_p(k)$ determined in accordance with the following equation where p is the predictor order:

$$\hat{y}_p(k) = -\sum_{i=1}^{p} \tilde{a}_i \tilde{y}(k-i)$$

At the output of the $p^{th}$ order predictor circuit 26 is provided a predicted zero mean data sequence $\hat{y}_p(k)$ which is fed to a second input of summer 16 and to a first input of a third summer 24. Therefore, the estimated zero mean input data $y(k)$ and the predicted zero mean input data sequence are fed to summer 16 and their difference provides a unquantized, unscaled error sequence $\hat{u}(k)$ as generally shown. The unquantized, unscaled error sequence $u(k)$ is fed to a first scalar 18 to scale $\hat{u}(k)$ by the quantized gain factor ($\tilde{g}$).

The $p^{th}$ order predicted zero mean input data sequence is provided from a recursive loop including a scaled quantized prediction error sequence $v(k)$ provided from a B-bit scalar quantizer 28 and a selected number of previous samples from the sequence $\hat{y}_p(k)$. The number of selected samples indicates the order of the prediction and is preferably matched to the order of the process represented in the input data if such order can be ascertained. In either event, the $p^{th}$ order is selected to minimize the power in the unquantized prediction error sequence $\hat{u}(k)$ as is known.

Returning momentarily to summer 16, the output $\hat{u}(k)$ of summer 16 represents the unscaled, unquantized predicted error which corresponds to the difference between the estimated error in the zero mean input data stream y(k) and the predicted error in the zero mean input data stream $\hat{y}_p(k)$. This unscaled, unquantized predicted error sequence $\hat{u}(k)$ is scaled by the quantized gain factor $\tilde{g}$ here typically a multiplicative operation provided by a multiplier 18 to boost $\hat{u}(k)$ into a range of integer numbers in preparation for a scalar quantization of such sequences to B number of bits. The B-bit scalar quantizer 20 is fed by a value B representing the desired number of bits which will be used to represent in the quantized prediction error signal v(k), each sample of the signal input data or sample in the unquantized error prediction sequence $\hat{u}(k)$.

In accordance with the value of B, the data from the output of the B-bit scalar quantizer 20 will be a quantized prediction error sequence which represents a prediction error for each data sample in the original input data stream y'(k). The number of bits of data used to represent this prediction could be any desired initial number. For example, B could be equal to ... ½, 1, 2 . . . and so forth. For B=½, two consecutive input data samples would be represented by 1 prediction error bit in the prediction error sequence v(k) thus providing an overall high compression ratio but at a relatively high distortion level. Here, the distorted level is a measure of the difference between the original input data y'(k) and a reconstructed input data stream y'$_r$(k) by the use of the quantized linear prediction coefficients {$\tilde{a}_i$}, quantized input signal mean $\tilde{y}$, quantized prediction error sequence v(k), and quantized gain "$\tilde{g}$". For B=1 the distortion level is lower than B=½ since there is a 1:1 correspondence between input data samples and prediction error bits. This, however, is accomplished at the expense of a reduction in compression ratio compared to the situation when B=½. For B=2, the distortion level is further reduced, however, so is the compression ratio.

To provide the predicted zero mean input data sequence, $\hat{y}_p(k)$, the quantized prediction error sequence v(k) from the B-bit scalar quantizer 20 is fed to the second scalar 22 to scale the data by a value here corresponding to (1/$\tilde{g}$) or to normalize the samples of v(k) by the gain factor $\tilde{g}$. Thus, scalar 22 is typically a divider, as shown. This unscaled, quantized error stream is fed to the third summer 24. The sum of this unscaled, prediction error sequence, as well as the $p^{th}$ order predictor data stream $\hat{y}_p(k)$ is fed back to the input of the $p^{th}$ order predictor 26. This second recursive loop thus is used to enhance the value of $\hat{y}_p(k)$ and to make $\hat{y}_p(k)$ correspond as closely as possible to y(k), thus reducing the errors represented by $\hat{u}(k)$. The $p^{th}$ order prediction circuit attempts to reconstruct the zero mean input data sequence (without the input signal mean level) from knowledge of the quantized linear prediction coefficients {$\tilde{a}_i$}. This provides the predicted error sequence $\hat{y}_p(k)$ which is compared to the estimated error sequence y(k) to provide the unquantized, unscaled error sequence u(k) in accordance with u(k)=y(k)−$\hat{y}_p(k)$.

The B-bit scalar quantizer 20 is also fed a data word representing "B" the number of bits used by the B-bit scalar quantizer 20 to represent the bits per prediction error sample correspondence to the original input data stream y'(k) as discussed above. The data word is fed from a incrementor 21 which here may be a counter or a shift register in accordance with the exact coding used to represent B in the scalar quantizer 20.

Such an incrementor 21 is initially set at a preselected value which provides maximum compression of the input data stream and minimal distortion of said data stream over a substantial majority of blocks of such data taking into consideration the character and nature of the data stream. Thus, for example, when processing image sonar data in which most of the image frames of data, as well as most of the data contained in each image frame is background noise or noise only data a value of B corresponding to B=1 is generally suitable particularly for a desired compression ratio of approximately 6:1 with M=128 data points.

However, it has been observed that when there are rapid changes in the data such as, for example, the occurrence of bright spots or sharp changes in contrast, the ADPCM process thus far described introduces undesirable and unwanted errors at the interfaces between data which is substantially smooth and predictable to data which has a high rate of change and thus unpredictability. Therefore, when the ADPCM parameters: v(k) the quantized predicted error sequence, $\tilde{y}$ the quantized input signal mean level, {$\tilde{a}_i$} the quantized linear prediction coefficients, and g the gain factor are fed to a ADPCM decoder, large reconstruction errors are produced in those blocks of data corresponding to occurrences of sudden bright spots or sudden changes in contrast or intensity.

In order to avoid these large reconstruction errors without substantially reducing the overall compression ratio of the data, a B-bit adaptive algorithm in accordance with the present invention is used in the ADPCM encoder 12.

Thus, as mentioned above, here the ADPCM data compressor 10 further includes a ADPCM decoder 40 which is fed v(k), $\tilde{y}$, {$\tilde{a}_i$} and $\tilde{g}$. These parameters are used to provide a reconstructed data stream y'$_r$(k) at line 51, as shown. Here the reconstructed data is provided by normalizing the quantized predicted error sequence v(k) by the quantized gain factor $\tilde{g}$. Accordingly, the quantized prediction error sequence v(k) is divided by the gain factor $\tilde{g}$ in divider 42. The output of divider 42 here $\hat{u}(k)$ is fed to an input of a first summer 44 of decoder 40. The other input of summer 44 is fed by a data stream from a third, recursive loop which data corresponds to a prediction of the zero mean input data $\hat{y}_p(k)$. This predicted data stream $\hat{y}_p(k)$ is provided from the quantized linear prediction coefficients {$\tilde{a}_i$} and $\tilde{y}(k)$ the predicted error sequence provided at the output of summer 44. The predicted data stream $\hat{y}_p(k)$ is a $p^{th}$ order prediction used to match the order of the predictor 26 referred to above.

Thus, this third recursive loop is used to provide a data sequence $\tilde{y}(k)$ corresponding to the sum of the unscaled, unquantized predicted error sequence $\hat{u}(k)$ and the $p^{th}$ order zero mean predicted input data sequence $\hat{y}_p(k)$. Thus, $\tilde{y}(k)$ corresponds to the sum of the unscaled error sequence $\hat{u}(k)$ and zero mean predicted input data sequence $\hat{y}_p(k)$ from the $p^{th}$ order predictor 48 as provided by the quantized linear prediction coefficients $\{\tilde{a}_i\}$. This data stream $\tilde{y}(k)$ corresponds to a zero mean reconstructed input data sequence. Each sample of $\tilde{y}(k)$ is fed to a first input of a second adder 46. A second input of adder 46 is fed $\tilde{y}$ the quantized input data mean level. Adder 46 thus adds the estimated, quantized input signal mean level $\tilde{y}$ to each sample of $\tilde{y}(k)$. The output sequence $y_r(k)$ of said summer 46 is fed to a limiter 50 which limits the data to a range corresponding to the original number of bits in each sample of the data block. Here for a sample size of 7 data bits and 1 sign bit (1 byte), the limiter 50 limits the data to a range of $2^0-1$ to $2^7-1$ or 0 to 127 and with the sign bit then the data can range from $-128$ to $+127$. In essence, limiter 50 restricts the reconstructed data to the range of the original input data y'(k) which in the example given here is positive data between 0 and 127.

At the output of limiter 50 thus is provided a reconstructed data sequence y'$_r$(k) which corresponds to a reconstructed version of the original input data stream y'(k). The original input data stream y'(k) which could also be stored in a memory 62, as well as the reconstructed input data stream y'$_r$(k), are fed to an distortion detection circuit 52 to provide an indication of the difference or distortion between the original input data stream and the reconstructed data stream. Any known type of distortion processing could be used for distortion detection circuit 52. For example, the error could be based upon an RMS type of distortion over the data block, a peak distortion detected within the data block or other desired distortion criteria.

The B-adaptive ADPCM data compressor 10 adjusts, when necessary, the value of B for selective ones of the plurality of blocks of data in order to minimize any of the above described distortion level criteria either over the data block or on a data sample basis within the data block below a preaccepted distortion level. However, this error threshold is generally also set so that when operating on, for example, homogenous data such as noise-only data as encountered in a sonar, the compression ratio is at a desired higher amount. If the detected distortion level is below the maximum allowable level then the computed values of $\tilde{y}$, $\{\tilde{a}_i\}$, $\tilde{g}$, and v(k) and B are fed to memory 60 and ultimately configured for transmission via a data path 64 to a user device 70, for example. Thereafter, a new data block is provided from device 11 as y'(k).

Accordingly, the determination of an appropriate distortion or maximum permissible distortion level depends upon the type of input data being processed. The preservation of a substantially high compression ratio for the B-adaptive ADPCM data compressor is provided by taking into consideration the relative smoothness of the input data. That is, since most image frames contain data which is noise-only data, in most instances the ADPCM normal processing is used without a significant degradation in compression ratio. The only difference in compression ratio provided in accordance with the present invention is the need to include an overhead word H which specifies the number of bits corresponding to the value of B used for the particular block.

Over most image data blocks the noise-only characteristic of the data will permit an initial pre-selected value of B such as B=1, for example, to be used for each of said blocks. On certain blocks of data having information other than noise-only information, when the value of B is increased, the B-adaptive ADPCM technique will reduce the compression ratio of the data. Nevertheless over the plurality of data blocks, the compression ratio will remain relatively high, and close to the compression ratio achieved by the conventional ADPCM processing.

Referring now to FIGS. 2A-2D, a flow chart of the B-adaptive ADPCM technique is shown. An initial step 110 in this process is partitioning the input data stream into here equal blocks each of M length or M number of input samples. Each of the aforementioned blocks of data are operated on using the below mentioned steps. From a first block of data which can include any size block of data and here which is represented by M=128 data samples, a mean value (y) of the data y'(k) is computed at step 112 using Equation 1. At step 114 the mean value $\bar{y}$ of the data y'(k) is subtracted from each of the input data samples to provide a zero mean input data sequence y(k). Concurrently, from the input data y'(k) and from the knowledge of the mean value $\bar{y}$ of the input data y'(k) an initial estimate is made of the prediction coefficients $\{\hat{a}_i\}$ and gain factor $(\hat{g})$, Equations 2, 2B, and 3 above, at step 116. The prediction coefficients and the gain factor having been estimated, the value of B, the number of bits representing the prediction error, is initialized at step 118. Here for sonar data characterized as relatively smooth and predictable, the initial value of B is typically set to B=1. Each of the data parameters $\bar{y}$, $\hat{g}$, $\{\hat{a}_i\}$ are quantized at step 120 using $B_c$ and $M_y$ to set the number of quantization bits and limits on the data. The parameters of the prediction filter are initialized at step 122 and the quantized data parameters $\{\tilde{a}_i\}$, and y are sent to a prediction filter (at step 124). A $p^{th}$ order prediction sequence $\hat{y}_p(k)$ is provided in accordance with the equation $$\hat{y}_p(k) = -\sum_{i=1}^{p} \tilde{a}_i \tilde{y}(k-1)$$

at step 128 to provide samples of the sequence $\hat{y}_p(k)$. A first order prediction filter would provide values of $\hat{y}_p(k)$ from the previous samples of $\tilde{y}(k)$ whereas a second order prediction filter would provide such values of $\hat{y}_p(k)$ from the two previous samples of $\tilde{y}(k)$. From the $p^{th}$ order prediction sequence $\hat{y}_p(k)$ whose order is selected to match as closely as possible the order of the process represented by the data, the prediction error $\hat{u}(k)$ is calculated at step 130 in accordance with the equation $y(k) - \hat{y}_p(k) = \hat{u}(k)$. The order is selected to minimize the power in $\hat{u}(k)$. Each sample in the unscaled, unquantized prediction error sequence is scaled by the gain factor $\tilde{g}$ step 134. The scaled gain factor $\tilde{g}$ is used to boost the unquantized prediction error $\hat{u}(k)$ into the range of a quantizer by representing said scaled samples of $\hat{u}(k)$ as integer values. The scaled samples of $\hat{u}(k)$ are quantized to B-bits per sample at step 136 in accordance with the value of B as initially determined in step 120 above providing the quantized prediction error sequence v(k).

At this juncture quantized parameters $\tilde{g}$, $\tilde{y}$, $\{\tilde{a}_i\}$, and v(k) are used to reconstruct the input data stream that is to provide a reconstructed input data stream y'$_r$(k). Each sample of the sequence v(k) is scaled by an inverse gain factor $1/\tilde{g}$ (i.e. normalized by $\tilde{g}$) at step 138 and is used to compute predicted zero mean input data samples $\hat{y}(k)$ in accordance with $\hat{y}_p(k) + \tilde{g}^{-1}v(k) = \tilde{y}(k)$ at step 140. The value of the computed predicted zero mean input data samples are added to the quantized mean level at step 142 and sent to a limiter at step 144 to limit the data range in accordance with the number of bits used in the input data samples here assuming all positive values $2^0-1$ to $2^7-1$ or 0 to 127. At the end of the limiter step 144 is the reconstructed input data sequence y'$_r$(k). The reconstructed input data sequence y'$_r$(k) is compared with the initial input data y'(k) and using any desired distortion criteria such as a RMS distortion or peak distortion criteria and so forth to provide distortion level at step 146. Here the distortion level provided at step 146 is a peak level on a sample by sample basis. That is, the sequence e(k)=y'$_r$(k)−y'(k) is constructed and each sample of the sequence e(k) is tested to see if the error is higher than a predetermined distortion threshold or maximum distortion $E_{MAX}$ at step 148. If the distortion level e(k) is greater than the error threshold ($E_{MAX}$) then the value of B is tested at step 150 to see if the value of B is less than a specific maximum value ($B_{max}-1$). If the value of B is less than $B_{max}-1$). If the value of B is less than $B_{max}-1$ then B is incremented at step 154 and the ADPCM process from step 120 through step 146 being repeated to provide new values of u(k) and v(k) using the new value of B. However, if the value of B is equal to $B_{max}-1$ then the pulse code modulation technique is performed with B equal to $B_{max}$ on the entire data block and the processing of the data block ends at the end of step 156.

If the value of the reconstruction error is less than the threshold value, then a sequence index generator is updated at step 158 to increment the index (k) and provide the next sample of e(k). The loop will continue until B=$B_{max}-1$ or the value |e(k)| is less than $E_{max}$ over the entire sequence of e(k). Thus, this error is computed on a sample-by-sample basis. Thus, when e(k)<$E_{max}$ or B=$B_{max}$, the last values of the quantized linear prediction coefficients ($\{\hat{a}_i\}$), quantized gain factor ($\hat{g}$), quantized input signal mean ($\hat{y}$) and quantized prediction error sequence v(k) along with the value of B, are then fed to the user device 70.

Alternatively, at step 146 an RMS error could be calculated over the entire sequence y$_r$'(k). The flow diagram would be modified to permit reconstruction of the entire data sequence y'$_r$(k). After testing of the RMS error E vs $E_{MAX}$ either B would be incremented, if necessary, and the process repeated or the parameter would be transmitted and a new block of data would be processed.

As a further alternative, after B reaches $B_{MAX}$, if the error is still greater than the threshold, rather than ending processing on the data, new values of B$_c$ the quantizer bits for the parameters $\{\hat{a}_i\}$; $\tilde{g}$; and $\hat{y}$ can be increased and then new values of $\{\tilde{a}_i\}$; $\tilde{g}$; and $\tilde{y}$ can be provided along with a new sequence u(k) and v(k) to further lower distortion levels.

In general, the above is accomplished under control of a system controller (not shown). Thus for FIG. 1, if the reconstruction error is acceptable then signal XMTDTA is asserted and the ADPCM coefficients in buffer 60 are transferred via channel 64 to user device 70 and INIT B is asserted to initialize B to its nominal or initial value If the error is not acceptable then XMTDTA is not asserted and INC B is asserted to provide an incremented value of B and the sequence v(k) is recalculated using a larger number of bits B to represent the prediction error.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A method of processing a stream of digital data indicative of an image to provide to a user device comprising the steps of:

partitioning the stream of data into a plurality of blocks of data elements;

computing quantized linear prediction coefficients, a quantized input mean level, a quantized gain factor, and a unquantized prediction error sequence associated with a first one of said blocks of data, said computing step further comprising the step of quantizing the unquantized prediction error sequence for said block of data to provide a quantized prediction error sequence with each unquantized sample in said unquantized prediction error sequence being represented by a first selected number of bits in said quantized prediction error sequence;

reconstructing the input data in each block of data from the quantized linear prediction coefficients, input mean level, quantized gain factor, and quantized prediction error sequence;

providing a distortion level representative of the difference between the reconstructed data and the input data;

comparing said distortion level to a preselected distortion level maximum and when said distortion level exceeds the distortion level maximum, recomputing the unquantized prediction error sequence for said block of data following a quantized prediction error sequence using a higher number of bits in the quantized prediction error sequence to represent the prediction error in each sample of the unquantized prediction error sequence; and providing said quantized linear prediction coefficients, quantized input mean level, quantized gain factor, and quantized prediction error sequence associated with the first one of said blocks of data to the user device.

2. The method, as recited in claim 1, further comprising the step of:

repeating each of the steps of claim 1 for each block of data in the stream of digital data.

3. The method, as recited in claim 1, wherein the step of providing a distortion level comprises the step of calculating a RMS distortion level over the block of data.

4. The method, as recited in claim 1, wherein the step of providing a distortion level comprises the step of calculating a peak distortion level of a data sample within the block of data.

5. The method, as recited in claim 1, further comprising the step of:

storing quantized linear prediction coefficients, quantized input mean level, quantized gain and quantized prediction error sequence, and a word representing the number of bits used to represent the prediction error in the quantized prediction error; and wherein said step of comparing said distortion level to a preselected distortion level further comprises the steps of:

transmitting said stored parameters when the computed distortion level is less than the preselected distortion level maximum.

6. The method, as recited in claim 5, wherein during said comparing step the distortion level exceeds the preselected distortion level maximum an wherein said method further comprises the step of:

storing recomputated quantized linear predictive coefficients, quantized input signal mean, quantized gain, and quantized prediction error sequence for said block of data and a new value of the number of bits used to represent the prediction error in said quantized prediction error sequence.

7. The method, as recited in claim 1, wherein said input data stream represents image sonar data.

8. The method, as recited in claim 7, wherein a quantized linear prediction coefficient, input mean level and gain, and prediction error sequence which provides a reconstructed input data that does not exceed a predetermined distortion level, is provided, and wherein said method further comprises the step of:

transmitting said parameters to a user device and wherein said user device reconstructs the input data from said transmitted parameters.

9. The method, as recited in claim 1, wherein during said comparing step when the distortion level exceeds the distortion level maximum and a value of the number of bits used to represent the prediction error in the quantized prediction error sequence equals the maximum of bits, further comprising the step of:

recomputing quantized linear predictive coefficients, quantized input mean, quantized gain, and the unquantized prediction error sequence for said block of data and a quantized prediction error sequence using a higher number of bits in the quantized prediction error sequence to represent the prediction error in each sample of the unquantized prediction error sequence and further using a higher number of bits to represent the linear predictive coefficients, input mean, and gain in the quantized linear predictive coefficients, quantized input mean, and quantized gain.

10. Apparatus for processing a stream of digital data indicative of an image to provide to a user device, the apparatus comprising:

means for partitioning the stream of data into a plurality of blocks of data samples;

means for computing quantized linear prediction coefficients, quantized gain and quantized input signal mean level, and a unquantized prediction error sequence associated with a first one of said blocks of data, said computing means further comprising:

means for quantizing said unquantized prediction error sequence with each prediction error sample in said unquantized prediction error sequence being quantized to a first selected number of bits in said quantized prediction error sequence;

means for reconstructing the input data in each block of data from the quantized linear prediction coefficients, quantized gain and quantized input signal mean level, and quantized prediction error sequence;

means for calculating a distortion level representative of a difference between the reconstructed data and the input data;

means for comparing said distortion level to a preselected distortion level maximum to produce an indication when the distortion level exceeds the predetermined maximum; and means for recomputing the unquantized prediction error sequence for the block of input data when the distortion level exceeds the preselected distortion level maximum and means for quantizing said recomputed unquantized prediction error sequence using a higher number of bits to represent each prediction error sample; and means for providing said quantized linear prediction coefficients, quantized gain and quantized input signal mean level, and quantized prediction error sequence associated with the first one of said blocks of data to the user device.

11. Apparatus, as recited in claim 10, further comprising means for providing an RMS distortion level over the block of data.

12. Apparatus, as recited in claim 11, further comprising means for computing a peak distortion level of a data sample within the block of data samples.

13. Apparatus, as recited in claim 11, further comprising means for storing quantized linear prediction coefficients, quantized gain and quantized input signal mean level, and quantized prediction error sequence and a word representing the number of bits used to represent the prediction error in the quantized prediction error sequence and means for transmitting said stored parameters when a computed distortion level is less than the preselected distortion level maximum.

14. Apparatus, as recited in claim 13, further comprising means for increasing the number of bits used to represent the quantized linear predictive coefficients, quantized gain, and quantized input mean, and means for computing new values of said parameters using a higher number of quantizing bits and for recomputing the quantized error prediction sequence using a higher number of bits when the value of bits used to represent the prediction error equals a maximum number of selected bits.

* * * * *